United States Patent [19]
Miller

[11] Patent Number: 6,073,261
[45] Date of Patent: Jun. 6, 2000

[54] CIRCUIT FOR EVALUATING SIGNAL TIMING

[75] Inventor: Brian C. Miller, Ft. Collins, Colo.

[73] Assignee: Hewlett Packard Company, Palo Alto, Calif.

[21] Appl. No.: 09/083,311

[22] Filed: May 22, 1998

[51] Int. Cl.[7] .................................................. G01R 31/28

[52] U.S. Cl. .......................... 714/731; 714/724; 714/726; 714/744

[58] Field of Search ..................................... 714/731, 727, 714/729, 744, 726, 724; 375/226, 371

[56] References Cited

U.S. PATENT DOCUMENTS

| | | | |
|---|---|---|---|
| 5,208,764 | 5/1993 | Rusu et al. | 395/500.09 |
| 5,384,494 | 1/1995 | Henson et al. | 327/202 |
| 5,642,362 | 6/1997 | Savir | 714/726 |
| 5,923,676 | 7/1999 | Sunter et al. | 714/733 |
| 5,938,780 | 8/1999 | Panis | 714/744 X |

Primary Examiner—Hoa Nguyen

[57] ABSTRACT

The present invention is generally directed to a circuit and method for evaluating the timing relationship of electrical signals in an integrated circuit. In accordance with one aspect of the invention, a circuit is provided having a signal select circuit that is includes two or more inputs and one output. The signal select circuit (preferably a multiplexer) is configured to select one of the two or more input signals for evaluation and direct it to the output. A plurality of signal buffers are electrically cascaded to the output of the signal select circuit. Finally, a scan chain having a plurality of scan elements is disposed to acquire a state of electrical signals along the plurality of signal buffers. In accordance with another aspect of the invention, a method is provided for evaluating the timing relationship of electrical signals in an integrated circuit. In accordance with this inventive aspect, the method includes the steps of selecting a first electrical signal to be evaluated and discretizing the selected electrical signal into a plurality of signal values closely spaced in time. This "discretizing" function is preferably achieved passing the selected signal through a plurality of cascaded delay or buffer elements, then loading the signal values output from each buffer element (at a given time instance) into a plurality of register elements. In this way, the register elements, collectively, contain a snapshot of the selected signal over a defined period of time. Finally, the method includes the step of evaluating the plurality of signal values.

21 Claims, 8 Drawing Sheets

Scan Chain Sig. 1 = 0 0 0 0 0 1 1 1

Scan Chain Sig. 2 = 0 0 0 0 0 0 0 1

FIG. 7B

CIRCUIT FOR EVALUATING SIGNAL TIMING

BACKGROUND OF THE INVENTION

1. Field of the Invention

The present invention generally relates to testing devices, and more particularly to a circuit that operates in conjunction with a scan buffer for evaluating timing characteristics of electrical signals in an integrated circuit.

2. Discussion of the Related Art

A variety of automatic test equipment (ATE) have long been known for testing electronic circuits, devices, and other semiconductor and electronic products. Generally, automatic test equipment are divided into two broad categories, analog testers and digital testers. As the names imply, analog testers are generally designed for testing analog circuit devices, while digital testers are designed for testing digital circuit devices. ATE are programmably controlled to be adapted or configured to test a variety of devices in a variety of ways. This is achieved by programming ATE inputs to inject a certain signal (or signal transition) and by programming ATE outputs to compare a value to a certain pin or signal line on a DUT.

An integrated circuit tester includes a set of modules or "nodes", wherein one node is associated with each terminal of a device under test (DUT). When the DUT is an integrated circuit chip (IC) chip, then one node may be associated with each pin of the IC chip. A test is organized into a set of successive time segments ("test cycles"). During any given test cycle, each node can either transmit a test signal to the pin, sample a DUT output signal at the associated pin, or do neither. Each node includes its own memory for storing a sequence of these transmit or sample commands ("test vectors").

As is known by those skilled in the art, a test generator is independent and distinct from a tester. A test generator uses a model of a device to formulate a set of test vectors that will efficiently test for and detect faults on the tested device. Whereas, a tester is a device disposed downstream of the test generator. It utilizes the set of test vectors generated by the test generator in order to test the actual device.

A test vector or test pattern, as generated by a test generator, is a string of n logic values (0, 1, or don't care–X) that are applied to the n corresponding primary inputs (PIs) of a circuit at the same time frame. A test sequence is a series of test vectors applied to a sequential circuit in a specific order to detect a target fault. The first vector in the test sequence assumes the circuit to be in a completely unknown state. A test set is an unordered set of test sequences.

Using the principals describe above, and as is known in the art, testing may be carried out on an integrated circuit to completely test its functionality, both with respect to combinational logic portions and sequential logic portions. Although this ability to test circuitry that is deeply embedded within an integrated circuit has vastly improved the design and debug of complex integrated circuit devices, further improvements are desired.

Specifically, one area where further improvements are desired relates to the area of timing evaluation. In connection with the design and testing of an integrated circuit component, it is often desired to be able to evaluate the timing relationship of signals. For example, when testing the propagation delay of a circuit component, it is helpful to be able to compare the timing relationship of an input signal with that of an output signal. Similarly, when testing for race conditions in combinational logic circuits, it is often desired to closely compare the timing of two or more relatively independent signals.

Accordingly, it is desired to provide a system that offers such testing capabilities in connection with a scan-type integrated circuit tester.

SUMMARY OF THE INVENTION

Certain objects, advantages and novel features of the invention will be set forth in part in the description that follows and in part will become apparent to those skilled in the art upon examination of the following or may be learned with the practice of the invention. The objects and advantages of the invention may be realized and obtained by means of the instrumentalities and combinations particularly pointed out in the appended claims.

To achieve the advantages and novel features, the present invention is generally directed to a circuit and method for evaluating the timing relationship of electrical signals in an integrated circuit. In accordance with one aspect of the invention, a circuit is provided having a signal select circuit that includes two or more inputs and one output. The signal select circuit (preferably a multiplexer) is configured to select one of the two or more input signals for evaluation and direct the selected signal to the output. A plurality of signal buffers are electrically cascaded to the output of the signal select circuit. Finally, a scan chain having a plurality of scan elements is disposed to acquire a state (i.e., value) of electrical signals along the plurality of signal buffers. Acquiring the state of the electrical signals along the plurality of signal buffers provides, in essence, a "snapshot" of the selected signal over a period of time. The length of the period of time within the "snapshot" is substantially equal to the cumulative delay of all the cascaded delay elements.

In accordance with the preferred embodiment, additional circuitry is provided to controllably shift the contents of the scan chain out of the integrated circuit, where they may be evaluated by, for example, an external computer or processor. In addition, further circuitry is configured to controllably select the particular electrical signal directed to the output of the signal select circuit. In practice, this circuitry controls select signals that are input to the multiplexer. Furthermore, the delay elements, or buffers, may be configured as simple inverters, to minimize the delay between the elements, and therefore maximize the resolution of the inventive circuit. In this regard, an inverter circuit may be designed by a simple coupled pair of field effect transistors. Such an implementation provides minimal delay (in practice approximately 100 picoseconds). As will be appreciated, non-inverting buffers or buffers comprising more complex circuitry will necessarily result in greater delays, and thus less resolution between signals. Of course, the particular buffer implementation will be determined largely by the degree of resolution desired. For a given number of buffer elements, as the degree of resolution increases, the overall time period of the "snapshot" is decreased. Conversely, as the degree of resolution decreases, a larger window or "snapshot" may be acquired. Thus, this aspect of the preferred embodiment, will necessarily depend upon design and testing objectives.

In accordance with another aspect of the invention, a method is provided for evaluating the timing relationship of electrical signals in an integrated circuit. In accordance with this inventive aspect, the method includes the steps of selecting a first electrical signal to be evaluated, and discretizing the selected electrical signal into a plurality of signal values closely spaced in time. This "discretizing" function is preferably achieved by passing the selected signal through a plurality of cascaded delay or buffer elements, then loading the signal values output from each buffer element (at a given time instance) into a plurality of register elements. In this way, the register elements, collectively, contain a snapshot of the selected signal over a defined period of time. Finally, the method includes the step of evaluating the plurality of signal values.

In accordance with the preferred embodiment, the step of selecting a first electrical signal is performed by controlling select lines of a multiplexer circuit to select one of a plurality of input signals. Consistent with the inventive concept, additional signals may be acquired, evaluated, and compared with the first selected signal. Specifically, the method may further include the steps of selecting a second electrical signal for evaluation, and discretizing the second signal into a plurality of signal values closely spaced in time. In this regard, an additional evaluating step may be provided, whereby the second discretized signal may be evaluated and compared with the first evaluated signal. Specifically, the relative timing of the two signals may be compared and evaluated.

DESCRIPTION OF THE DRAWINGS

The accompanying drawings incorporated in and forming a part of the specification, illustrate several aspects of the present invention, and together with the description serve to explain the principles of the invention. In the drawings.

DETAILED DESCRIPTION OF THE PREFERRED EMBODIMENT

Having summarized various aspects of the present invention, reference will now be made in detail to the description of the invention as illustrated in the drawings. While the invention will be described in connection with these drawings, there is no intent to limit it to the embodiment or embodiments disclosed therein. On the contrary, the intent is to cover all alternatives, modifications and equivalents included within the spirit and scope of the invention as defined by the appended claims.

Figure 1:
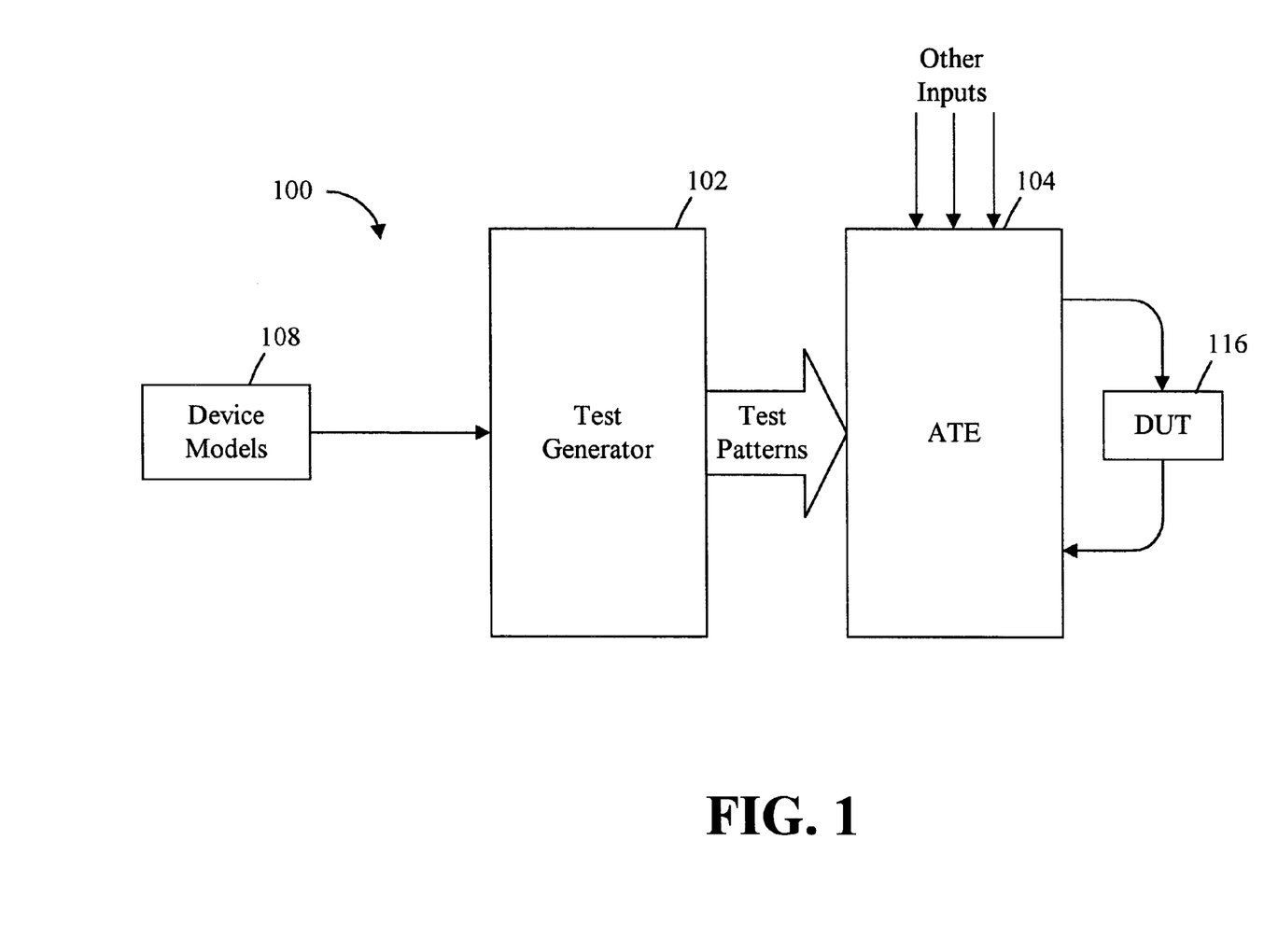
FIG. 1 is a block diagram of an automated testing device for testing digital electronic circuitry.

Referring now to FIG. 1, a block diagram of a testing system and process 100 is shown. Although the preferred embodiment of the present invention is directed to an improved testing circuit that is located within a DUT, FIG. 1 shows the components of the surrounding ATE environment. The system 100 includes a test generator 102 and an ATE 104. The test generator 102 generates test patterns (in a manner that is known in the art) that are communicated to the ATE 104, which may thereafter be used to test a device under test (DUT) 116. In accordance with the preferred embodiment, the DUT 116 is an integrated circuit chip, which is tested by applying input signals to one or more input pins and evaluating output signals delivered to one or more output pins of the DUT 116.

As is known, a comprehensive test plan for the DUT 116 includes a specification of the DUT 116 pins, voltage levels, timing, vectors, and tests. Specifically, a device model 108 contains data for logic and connectivity, and provides the data required for test generator 102 to generate the in-circuit tests. Typically, a device model 108 provides information regarding connectivity and structure of one or more devices. In addition, it specifies implied functions at a low level (such as AND, OR, and NOT, and perhaps other primitives as well). The test generator 102 uses the data provide from the device model 108 and may generate a compacted set of test vectors. Once the compacted set of test vectors is created, it is transferred to the ATE 104, where the compacted set may be used over and over to test DUTs 116.

Figure 2:
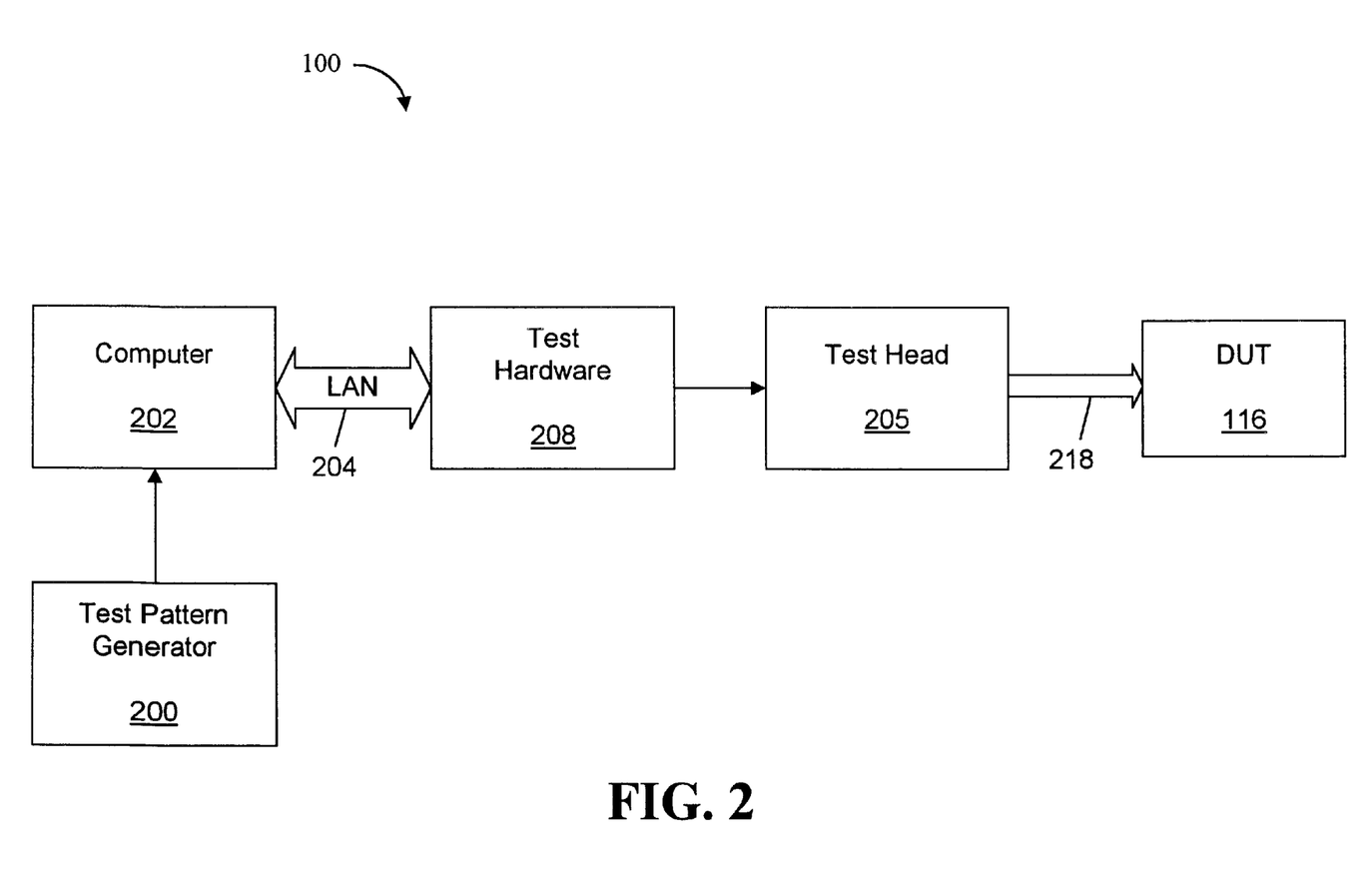
FIG. 2 is a block diagram illustrating an automated testing device.

Reference is now made to FIG. 2, which illustrates an environment in which the tester 100 may operate. A host computer 202 running an application program may be coupled to test hardware 208. In one embodiment, host computer 202 may be coupled to the test hardware 208 via a Local Area Network (LAN) 204. The test hardware 208 typically includes a test head 205 which provides the interface input and output to a DUT 116. The test hardware 208 may include devices, such as drivers and receivers, which can be used to perform testing on the DUT 116. An application program in the host computer 202 may communicate with an interpreter which performs Dynamic Link Library (DLL) calls which instruct remote test head 205 to perform a particular function. The test hardware 208 may receive instructions from the host computer 202. These instructions may then control the various tests that are run on DUT 116.

A test pattern generator 200 provides test pattern data that is input to the computer 202. As will be appreciated, the test pattern generator 200 operates to generate input test patterns before the actual testing execution takes place. Indeed, a compacted set of test patterns may be generated and stored on computer 202 for later test executions.

Figure 3:
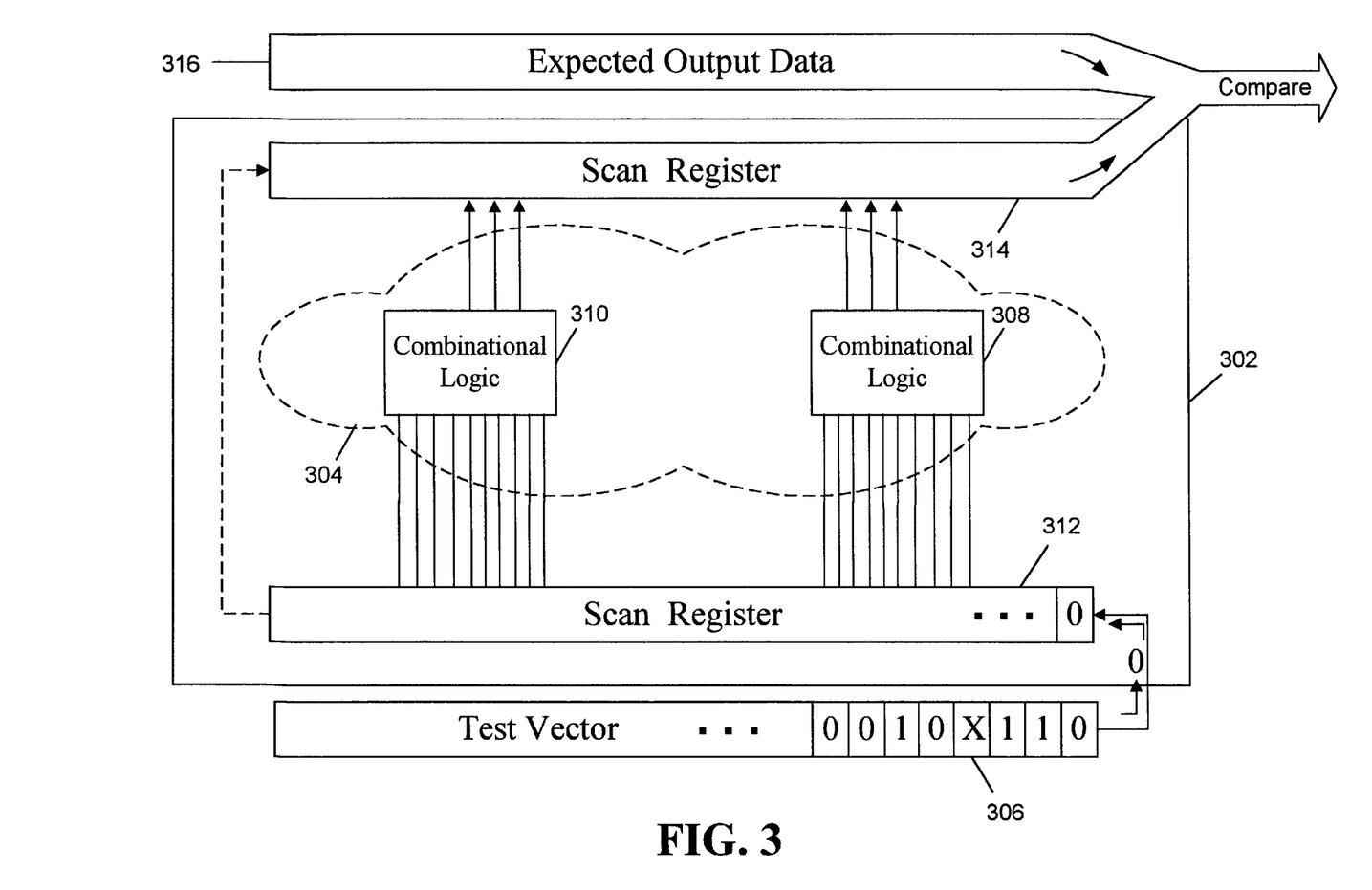
FIG. 3 is a block diagram conceptually illustrating fundamental components of an integrated circuit chip incorporating scan-type testing circuitry.

Referring now to FIG. 3, a block diagram is shown that illustrates a testing environment of the present invention. Specifically, the preferred embodiment of the present invention is directed to a circuit for evaluating timing characteristics of electrical signals, and is particularly suited for use in scan-type testing. As is known, broadside testing operates by applying test signals to the input pins of integrated circuit chips, and monitoring the output generated on output pins of that same chip. Due to the density of functional circuitry now provided on integrated circuit chips, scan-type testing is employed. To more specifically describe scan-type testing, if testing hardware has access only to the input and output pins of an integrated circuit chip, then the operation of the vast majority of the circuitry of most integrated circuit chips cannot practically be tested directly. Scan-type testing is achieved by providing specialized circuitry integrated within the integrated circuit chip to be tested that allows test inputs to be propagated into the chip for testing the functional logic thereof, and test outputs to be acquired.

By way of terminology, scan chains or scan registers are utilized in this fashion. For example, and in reference to FIG. 3, an integrated circuit chip 302 includes functional circuitry 304 (which may comprise both sequential and combinational logic) is provided on board the integrated circuit chip 302. A test vector 306 contains a plurality of bits that define the test input and output. As is known, the bits of the test vector 306 are generally set to values of either 1 or 0, but some may be don't care values (e.g., "X"). Often, the test vector 306 is rather lengthy, and may comprise several hundred, or even several thousand, bits. These bit values are then shifted serially into the integrated circuit chip 302 where they may be used to test combinational logic 308 and 310, which may be imbedded deep within the integrated circuit chip 302. In this regard, the bit values of the test vector 306 are shifted into a scan register 312. The scan register 312 is illustrated in the drawing as a single register. However, and as is known, the register may comprise a plurality of scan chains, which are individual registers or serial bit positions within the chip. Consistent with the terminology used herein, the collection of all the scan chains comprise a scan register. For purposes of simplicity and illustration, only one scan chain has been illustrated in FIG. 3.

In similar fashion, an output scan register 314 may be provided in connection with an output vector register 316. In operation (conceptually), the bits of the test vector 306 are shifted into the scan register 312. The various bit positions of the scan register 312 are input to combinational logic sections 308 and 310 of the integrated circuit 302. Once the entire test vector 306 has been shifted into the scan register 312, the outputs of the combinational logic sections 308 and 310 may be captured by the output scan register 314, then shifted out to an output register 316 where the values are compared against predefined expected data values. This concept is illustrated graphically by the "Compare" arrow.

It should be appreciated that the input scan register 312 and output scan register 314 have been illustrated as such merely to simplify the discussion herein. In practice, each bit position of a scan chain may be both an input and an output. That is, a test vector may be clocked into the chip via an input scan chain. Then, once the entire test vector is clocked into the chip, the functional circuitry to be tested is tested (by the vector), and the scan register may again be clocked to capture output values. At this time, the same scan chain/register may be viewed as an output scan register 314, and its value may be clocked out of the chip, where it is compared against an expected value for that register. Dashed lines coupling the two illustrated registers 314 and 316 depict this concept of register continuity and bi-directionality.

Figure 4:
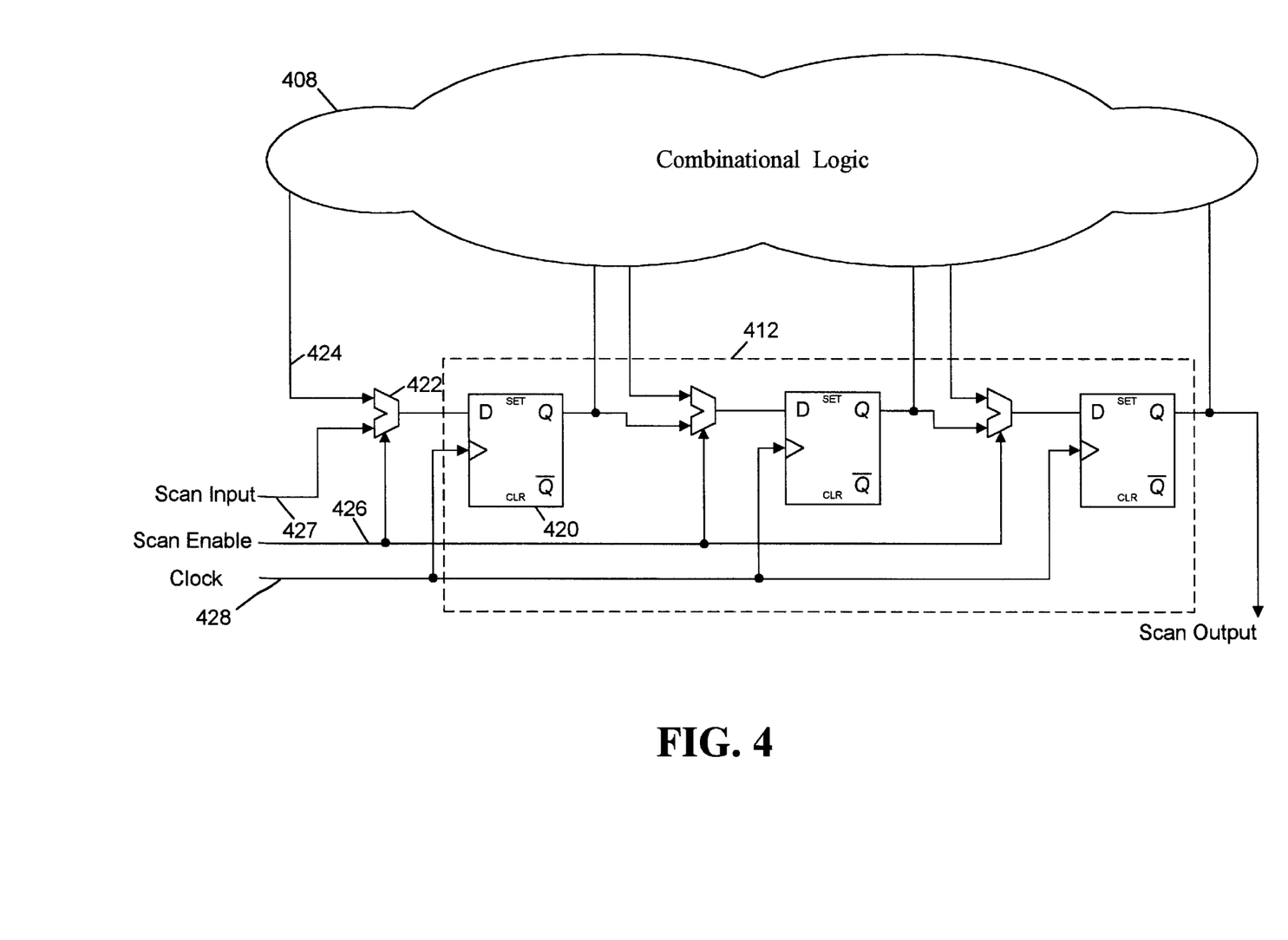
FIG. 4 is a schematic diagram illustrating components of an integrated circuit chip incorporating scan-type testing circuitry.
Figure 5:
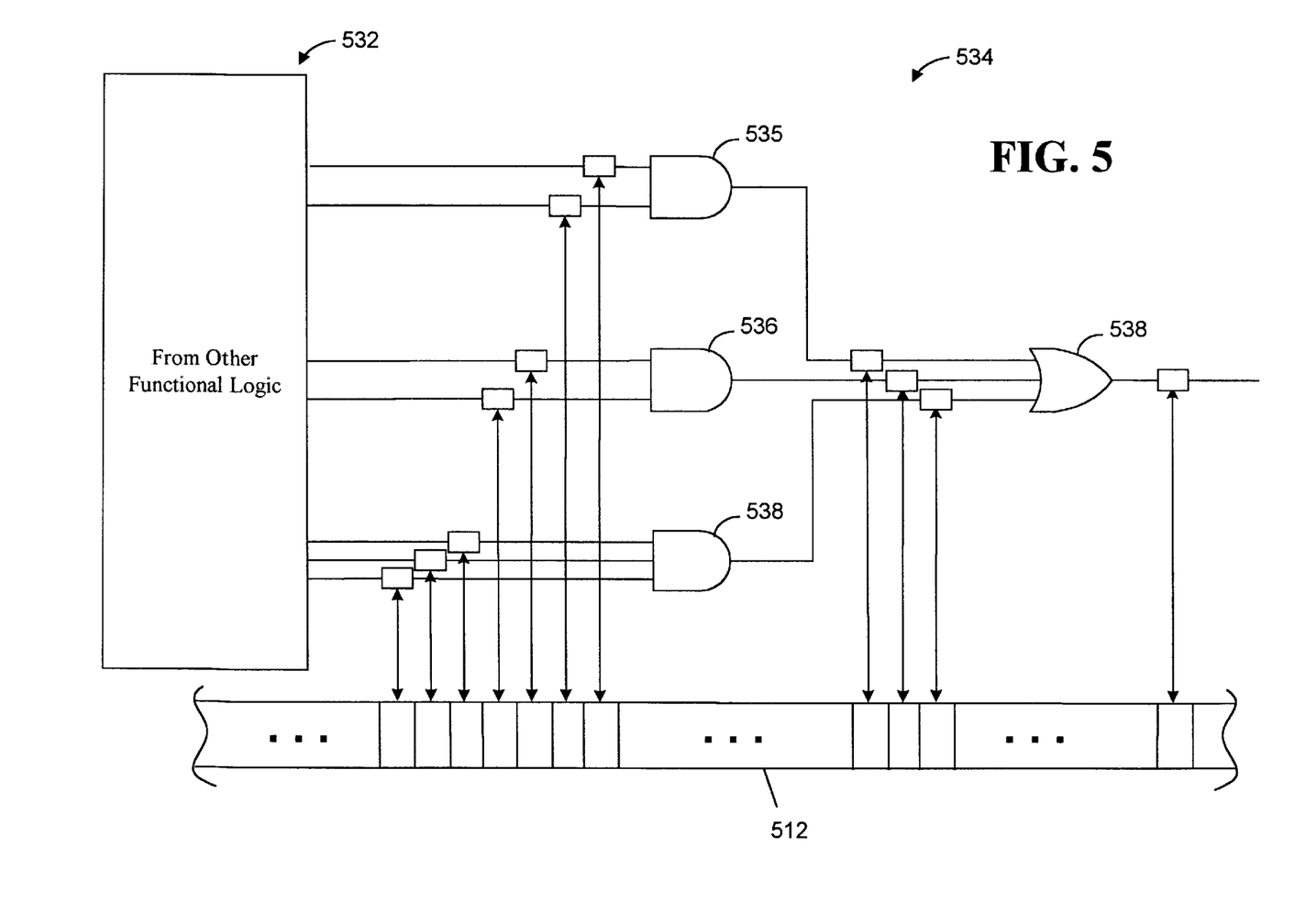
FIG. 5 is a schematic diagram illustrating more specific electrical circuit connections for scan-type circuit testing.

It will be appreciated that the diagram of FIG. 3 has been presented purely for purposes of illustration and, in light of the discussion that follows in connection with FIGS. 4 and 5, a better understanding of a scan-type tester for testing combinational logic will be appreciated. What should be appreciated from FIG. 3, however, is that by utilizing scan chains (or a scan register) bits of a test vector may be propagated into and out of an integrated circuit chip 302 to allow direct testing of functional logic that may be buried deep within the integrated circuit chip 302, and thus not directly accessible or testable by the pins of the integrated circuit chip 302.

Reference is now made to FIG. 4, which illustrates a more practical implementation of scan chains and a scan register. In this regard, instead of providing a separate register to comprise the scan register 312, typically sequential logic already embedded within the circuit chip is utilized. For example, and again for purposes of illustration, assume flip flops (e.g., 420) are provided in a integrated circuit chip, and are functionally configured to operate in a certain manner. Test vector values may be shifted into these registers via, for example, multiplexers 422. In this regard, a multiplexer 422 may have 2 inputs: one for receiving an input from the functional logic 424 provided on the chip, and one for receiving input values from a scan input 427 provided in connection with the testing configuration of the chip. A scan enable line 426 may be provided as a multiplexer select, to select which of the two inputs is routed through the multiplexer 422 to the flip flop 420. Once the various bit values have been directed to the inputs of multiplexers 422, the scan enable line 426 may be set to propagate the selected multiplexer input to the various sequential circuit devices (e.g., 420). As will be understood, a clock line (denoted as scan clock) 428 may be toggled to clock in the various bit values through the respective sequential circuit components comprising the scan chain (or scan register) 412.

In this way, the various outputs of the sequential circuit components may be controllably set in order to test the combinational logic 408 of the integrated circuit chip. In this regard, it is assumed that the functional logic of an integrated circuit chip will comprise a combination of sequential and combinational logic, which may be organized in various layers (e.g, a layer of sequential logic, then a layer of combinational logic, then a layer of sequential logic, another layer of combinational logic, etc.). Any given "layer" of combinational logic may be tested by controlling the values directed to the inputs of that combinational logic, in a manner described above and illustrated in connection with FIG. 4, and observing its outputs. The outputs of the combinational logic components may then be directed to one or more output scan chains, which then may be shifted serially out of the integrated circuit chip for evaluation by the testing equipment. In this regard, and as illustrated in FIG. 3, a separate output scan register may be formed within the chip, or alternatively, the output scan chain utilize the same sequential registers as the input scan chain.

Reference is made to FIG. 5 to further illustrate the concept of testing and test vectors in a target environment. In this regard, FIG. 5 illustrates a layer segment of combinational logic 534, with other functional (sequential and combinational) logic 532. In the illustrated embodiment, the segment of combinational logic 534 includes AND gates 535, 536 and 537, and an OR gate 538. A scan chain or scan register 512 is also illustrated as having bit values that are directly connected to signal lines of the various combinational logic circuit components. Although, as described in FIG. 4, the scan chain is preferably formed from sequential circuitry (such as D flip-flops), it has been illustrated in FIG. 5 in a different manner simply to facilitate the discussion herein. In the particular illustration of FIG. 5, each input line and output line of the various combinational logic components is associated with a bit position (e.g., one flip-flop) in the scan chain 512.

Figure 6A:
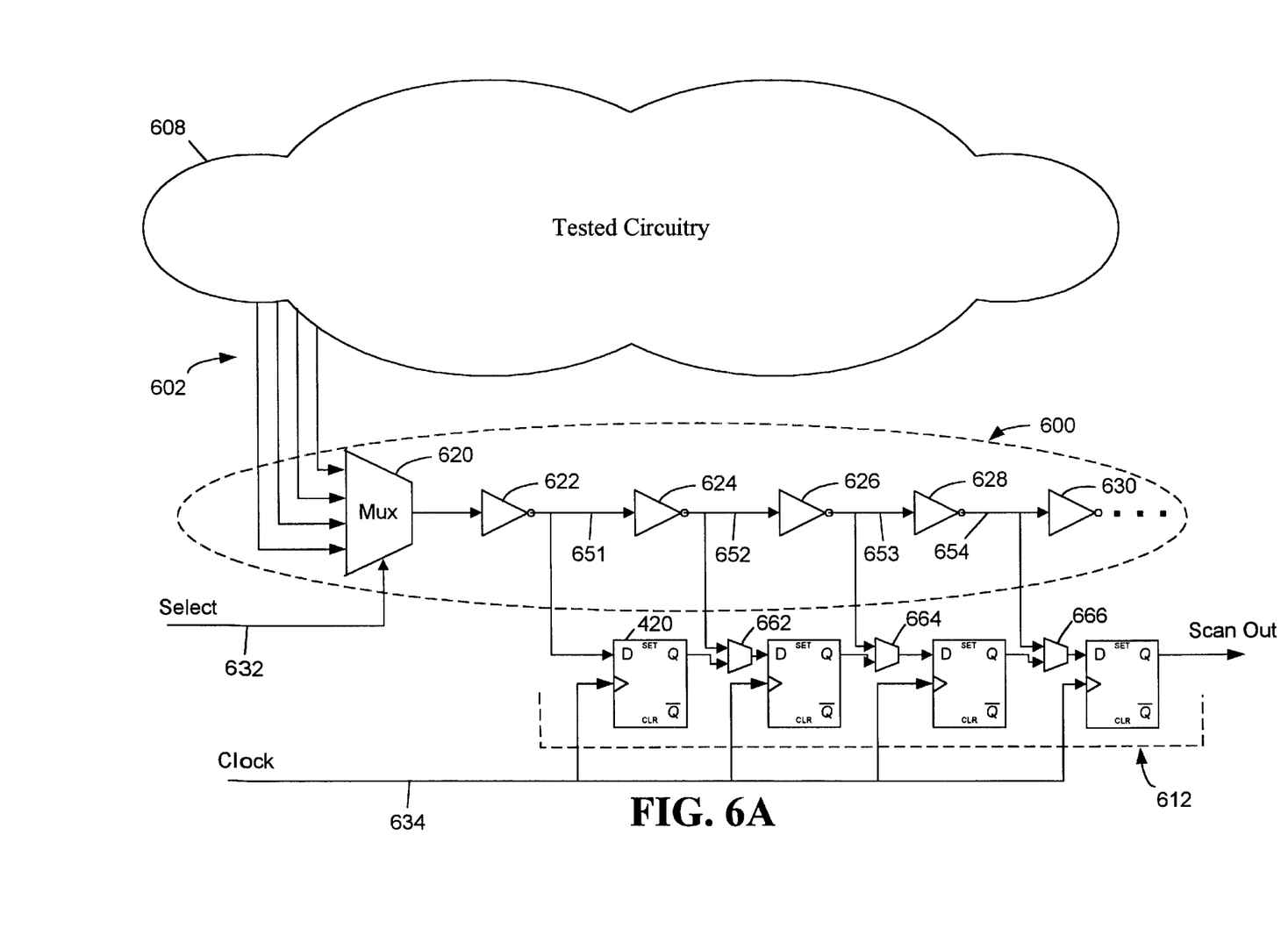
FIGS. 6A and 6B illustrate the fundamental components of a circuit constructed in accordance with the present invention, as embodied in an integrated circuit configured to perform scan-type testing.

Reference is now made to FIG. 6A, which illustrates the functional circuitry of the preferred embodiment of the present invention in the context of a scan-type tester, having surrounding circuitry similar to that illustrated in FIG. 4. As previously mentioned, the circuitry 600 of the present invention adapts a scan-type testing circuit to acquire electrical signals in such a fashion that in an evaluation of the timing of one or more signals may be conducted. In this regard, signals 602 may be tapped from the functional circuitry 608 that is to be tested, and routed to the circuitry 600 of the present invention.

In essence, the circuitry of the present invention is designed to include a signal selector circuit 620, and a plurality of delay elements 622, 624, 626, 628, and 630, electrically connected in series with the output of the signal select circuit 620. In accordance with a relatively simple implementation of the invention, and thus the preferred embodiment, the signal select circuit may be implemented by a multiplexer 620. While the multiplexer 620 in the illustrated embodiment shows four input signals, it will be appreciated that a much larger number of input signals may be routed to the multiplexer 620. Depending on the size of the multiplexer 620 (i.e., the number of input signals directed to it), one or more signal select lines 632 are utilized to control the operation of the multiplexer 620. Specifically, and as will be appreciated by those skilled in the art, the state of the one or more select lines 632 controllably determine which input signal of the multiplexer 620 is routed to the output thereof As will be appreciated by those skilled in the art (although not specifically illustrated), the signal select lines 632 (and thus the multiplexer 620) may be controlled by values within the scan chain itself, thereby avoiding the addition of special control circuitry.

The output of the multiplexer 620 then passes through the cascaded delay elements 622, 624, 626, 628, and 630. A clock signal 634, which controls the registers of an output scan chain or scan register 612, determines the instance of time when the state of the signals 651, 652, 653, and 654, among the delay elements 622, 624, 626, 628, and 630, will be acquired. For purposes of illustration, assume that the clock signal 634 is a periodic signal cycling at a frequency of 200 MHz. This would result in clock cycle period of 5 nanoseconds. Assume further that there is a 100 picosecond delay associated with each delay element 622, 624, 626, 628, and 630. By cascading 50 delay elements, the behavior of any selected electrical signal among the signal lines 602, between clock pulses of the selected signal, may be obtained. As will be appreciated by one skilled in the art, when the signals on lines 651, 652, 653, and 654 are acquired by the scan register 612, multiplexers 662, 664, and 666 are controlled accordingly. In this regard, select signals (not shown) will be controlled to route the signals on lines 652, 653, etc. through the multiplexers 662, 664, etc. when acquiring the signals. Thereafter, the input of the select line of multiplexer 662, 664, and 666 is controlled to route the Q input of the neighboring flip-flop through to the D input of the successive flip-flop. Thereafter, the clock signal 632 may be used to clock out the contents of the scan register 612 for evaluation.

Figure 6B:
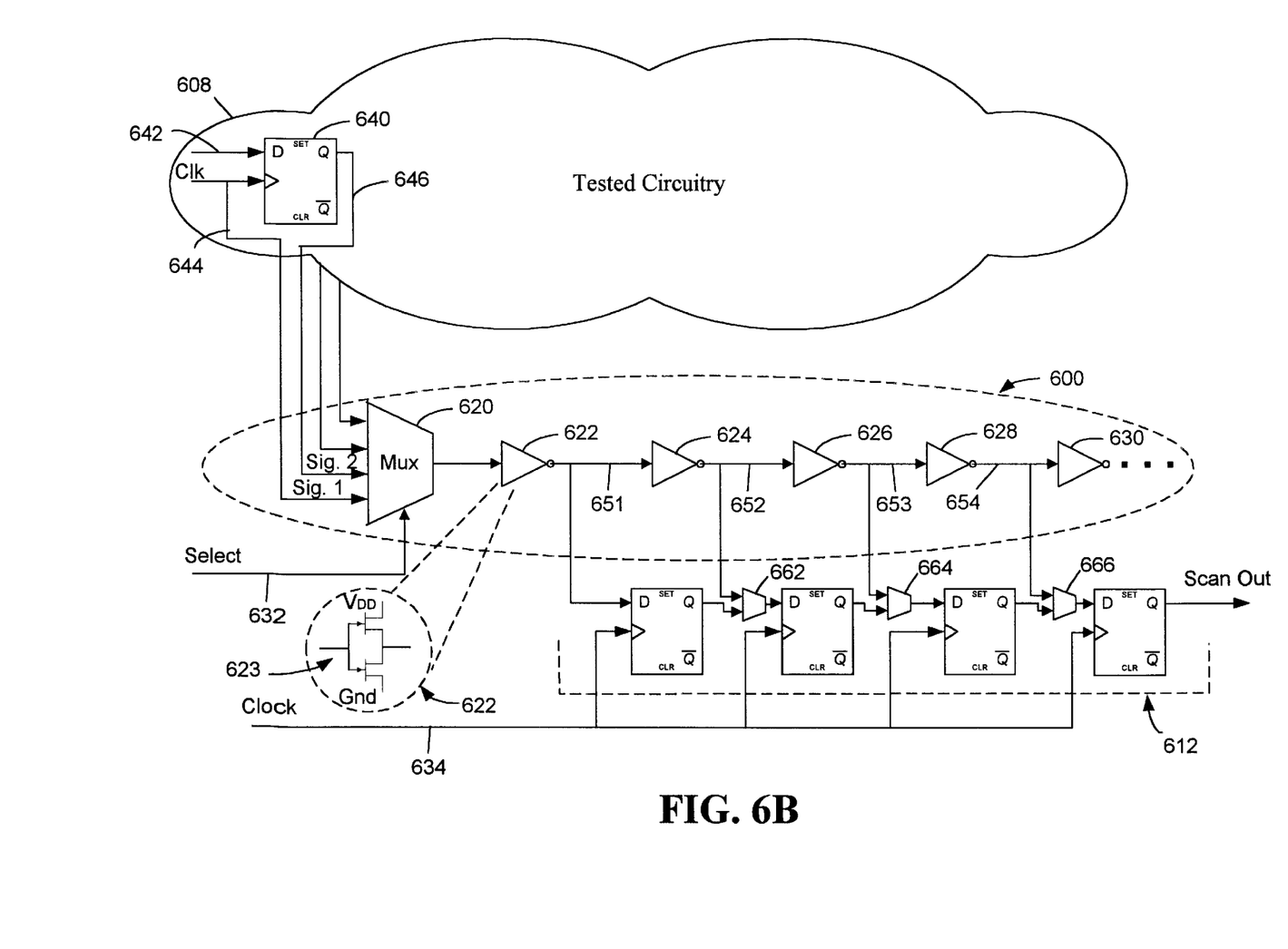

Having described the basic architecture of the present invention, reference is now made to FIG. 6B which illustrates the sampling and comparison of two signals (Sig. 1 and Sig. 2) of a portion of test circuitry 608. Specifically, assume that a D-type flip-flop element 640 is desired to be tested. The flip-flop 640 has an input signal 642, a clock signal 644 and an output signal 646. The circuit of the present invention may be configured to, for example, evaluate the timing of the propagation delay of the flip-flop 640. In this regard, the clock signal 644 and the output signal 646 are routed to the multiplexer 620 as Sig. 1 and Sig. 2.

Before describing this timing sequence, however, it will be appreciated by those skilled in the art that some degree of calibration and synchronization will be performed beforehand. For example, assume that the clock signal 644 is known to be a 200 MHz clock, thereby having a clock cycle period of 5 nanoseconds. Further assume that the series of buffers 622, 624, 626, 628, and 630 extends some 100 buffers in length. By clocking in the state on lines 651, 652, 653, 654, etc. into the scan register 612, it will be appreciated that (assuming an approximate 100 picosecond propagation delay in each delay in each delay element 622, 624, 626, 628, and 630) that more than one complete clock cycle of the clock signal 644 will be captured into the scan register, and thereafter shifted out. By evaluating the contents of the scan register bit by bit to determine the transition edges of the clock signal 644 (i.e., those bit locations in the scan register where the values go from zero to one or from one to zero), and realizing that the clock period is 5 nanoseconds, the 5 nanosecond clock period may be divided by the number of bit positions of the scan register that comprise an entire clock cycle to arrive at the precise propagation delay of each buffer element. In addition to such an initial calibration, it will be appreciated that, based upon the scan sequence (i.e., sequence of test vectors), synchronization between the clock signal 634 and the signals for evaluation (e.g., Sig. 1 and Sig. 2) will be provided.

In view of the foregoing, consider the following simple example. In evaluating the propagation delay of flip-flop 640, assume the input 642 is controlled (via test vector) to be a logic zero, which then gets clocked into the flip-flop 640 by clock line 644. Thereafter, the D input 642 is changed to a logic one, so that upon the next clock signal 644, the output 646 of flip-flop 640 will transition from a low state to a high state. It is this transition period that the present invention seeks to evaluate.

Figure 7A:
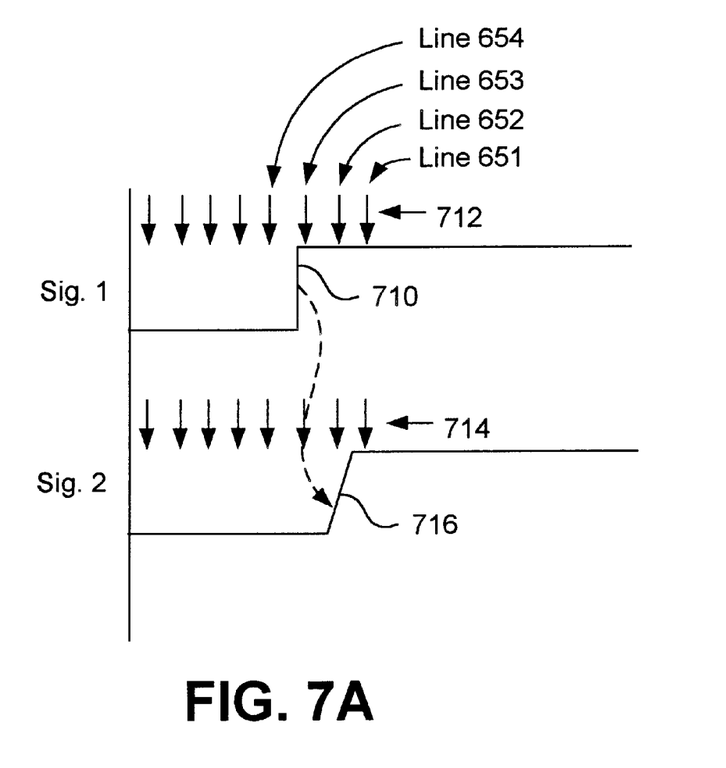
FIG. 7A is a timing diagram illustrating the discretizing function of the present invention for a short segment of two electric signals.
Figure 7B:
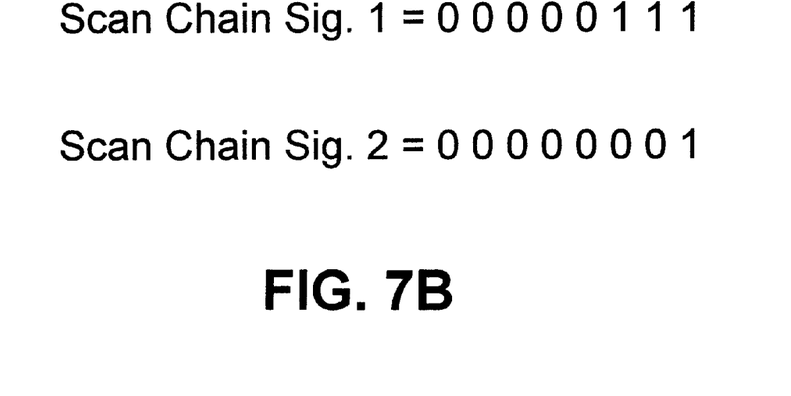
FIG. 7B is a diagram that illustrates the corresponding scan register contents that result from the discretizing of the signals shown in FIG. 7A.

Accordingly, and again recognizing there is some synchronization between clock 634—which will control the timing at which the various signal 651, 652, 653, and 654, etc. will be acquired by the scan register 612 and the clock signal 644—the clock 634 will initiate the sampling at some time period after the rising edge of the clock signal 644. In a first sequence, the signal select lines 632 will be configured such that Sig. 1 (Clk 644) will be directed to the output of multiplexer 620. At some time after the rising clock edge 644, the clock 634 will clock into the scan register 612 the value or state of lines 651, 652, 653, 654, etc. An illustration of this is provided in FIG. 7A. As shown, the sampling caused by clock 634 occurs shortly after the rising edge 710 of clock 644 or Sig. 1. The arrows 712 represent the time instance and values that are carried on lines 651, 652, 653, 654, etc. As on conventional graphs where time is displayed on the horizontal access, a view from right to left typically indicates a negative time progression (i.e., traveling back in time). The state of line 651 will be that which is closest in time to the current state of the signal. The progression through delay elements to signal lines 652, 653, 654, etc. reflect the state of the signal Sig. 1 as though looking backward in time. As will be appreciated from the timing diagram of FIG. 7A, the value of the scan chain for Sig. 1 is shown in FIG. 7B as being (from right to left) 111000000.

After acquiring the signal values into the scan register 612, the contents of the scan register 612 may be controllably scanned out of the integrated circuit, where it may be evaluated by, for example, a external processing unit. Since it is desired to evaluate the propagation delay, for example, of the flip-flop 640, another signal acquisition is required. In this regard, a similar, and preferably an identical, test vector sequence will be initiated so that the tested circuitry 608 is configured identically with its priorstate at the time the scan register acquired the state information. Then, at the same clock cycle of clock 634 in the testing sequence, the values on signal lines 651, 652, 653, 654, etc. will be clocked into the scan register 612. The difference, however, on the second sample run is that multiplexer select line(s) 632 will be configured to route the output 646 of flip-flop 640 through the multiplexer 620. This is illustrated by the lower timing diagram on FIG. 7A. As illustrated by the dash line, the rising edge 716 of Sig. 2 occurs in response to the rising edge 710 of Sig. 1. The arrows 714 represent the signal sample points (time spaced) that will be acquired by the scan register 612. More specifically, these values for the scan chain of Sig. 2 will be 10000000 (see FIG. 7B). Thus, a simple comparison of the scan chain for Sig. 1 and the scan chain for Sig. 2 show a two bit difference. Assuming that the delay elements 622, 624, 626, etc. are determined in the calibration step to comprise approximately a 100 picosecond delay, then it is realized that the propagation delay of flip-flop 640 is approximately equivalent to 2 delay elements (give or take an appropriate margin of error) or 200 picoseconds.

The foregoing has set forth a very basic example of how the structure of the present invention may be utilized to evaluate the timing relationship of signals in a portion of tested circuitry 608, whether it be combinational logic, sequential logic, or both. Certainly, consistent with the concepts and teaching of the invention, much more complex timing relationships may be evaluated, particularly by extending the cascaded delay elements into relatively long sequences. In the same fashion, the series of cascaded delay elements may be used to evaluate the timing characteristics of a single signal. In this regard, by capturing a signal just after an event in question has occurred, the effect on the signal of the event in question may be evaluated by examining the history of the selected signal, as evidenced by its state on the various signal lines 651, 652, 653, 654, etc.

In this regard, the delay elements 622, 624, etc. may preferably be designed to have a minimal amount of delay, so that the highest degree of resolution may be obtained. In this respect, a single delay element 622 may comprise a simple inverter circuit as configured by a pair of coupled field-effect transistors 623. Of course, configuring the delay elements as inverters will result in an inversion of the signal between each successive delay element 622, 624 etc. This inversion must therefore be taken into consideration after the contents of the scan register 612 and scanned to an output for evaluation. Alternatively, if such a degree of fine resolution is not demanded by the testing requirements of a particular circuit, then each delay element 622, 624, etc. may comprise a cascaded pair of inverters (e.g., no net inversion) such as that designated by reference numeral 623. In this respect, the delay associated with each delay element will essentially be twice that of what could be achieved by an inverter, but it simplifies the evaluation in that no signal inversion occurs between each sampling point 651, 652, 653, etc.

It will be appreciated that the invention described above enjoys a variety of benefits and advantages. For example, the inverters described in connection with FIG. 6B—i.e., constructed from a pair of FETs—require a minimal amount of die space. Accordingly, they may be positioned virtually anywhere on a die where space is available. In this way, the flexibility provided by the present invention may be added to an integrated circuit without sacrificing chip space.

The foregoing description has been presented for purposes of illustration and description. It is not intended to be exhaustive or to limit the invention to the precise forms disclosed. Obvious modifications or variations are possible in light of the above teachings. The embodiment or embodiments discussed were chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly and legally entitled.

What is claimed is:

1. A circuit for evaluating the timing relationship of electrical signals in an integrated circuit comprising:
   a signal select circuit having an output, the signal select circuit configured to select a signal for evaluation and direct it to the output;
   a plurality of signal buffers electrically cascaded to the output of the signal select circuit; and
   a scan chain having a plurality of scan elements disposed to acquire a state of electrical signals along the plurality of signal buffers.

2. The circuit as defined in claim 1, wherein the signal select circuit is a multiplexer circuit having a plurality of signal inputs and a signal output.

3. The circuit as defined in claim 1, further including a circuit configured to shift out of the electrical signal values acquired in the scan chain.

4. The circuit as defined in claim 1, further including a circuit configured to controllably select the electrical signal directed to the output of the signal select circuit.

5. The circuit as defined in claim 2, wherein the inputs of the signal select circuit are electrically connected to a plurality of circuit nodes having signals that are desired to be evaluated.

6. The circuit as defined in claim 1, wherein the signal buffers are inverters.

7. The circuit as defined in claim 1, further including a circuit configured to select at least two signals for comparison with one another.

8. The circuit as defined in claim 6, wherein the inverters are implemented in a pair of field-effect transistors.

9. A circuit for evaluating the timing relationship of electrical signals in an integrated circuit comprising:
   means for selecting a signal for evaluation, the signal selected from a plurality of input signals;
   means for discretizing the selected signal into a plurality of samples closely spaced in time; and
   means for acquiring the discretized selected signal for evaluation.

10. The circuit as defined in claim 9, means for selecting includes a multiplexer circuit.

11. The circuit as defined in claim 9, means for discretizing the selected signal includes a plurality of buffers cascaded with the output of the means for selecting.

12. The circuit as defined in claim 9, means for acquiring includes a scan chain having a plurality of registered circuit components.

13. A method for evaluating the timing relationship of electrical signals in an integrated circuit comprising the steps of:
   selecting a first electrical signal to be evaluated;
   discretizing the selected electrical signal into a plurality of signal values closely spaced in time; and
   evaluating the plurality of signal values.

14. The method as defined in claim 13, wherein the step of selecting a first electrical signal includes routing a signal through a multiplexer.

15. The circuit as defined in claim 13, wherein the step of discretizing the selected signal creates a plurality of time-spaced signal values that characterize the selected electrical signal.

16. The circuit as defined in claim 13, wherein the step of discretizing the selected signal includes the step of passing the selected signal through a plurality of cascaded circuit elements.

17. The circuit as defined in claim 16, wherein the circuit elements are inverters.

18. The circuit as defined in claim 13, further including the step of transferring the discretized signal into a plurality of register elements that form a scan chain.

19. The circuit as defined in claim 13, further including the step of selecting a second electrical signal for evaluation.

20. The circuit as defined in claim 19, further including the step of discretizing the second signal into a plurality of signal values closely spaced in time.

21. The circuit as defined in claim 20, further including the step of evaluating the second signal in relation to the first signal.

* * * * *